(12) United States Patent
Ng et al.

(10) Patent No.: US 10,580,782 B2
(45) Date of Patent: Mar. 3, 2020

(54) METHODS OF FORMING AN ARRAY OF ELEVATIONALLY-EXTENDING STRINGS OF MEMORY CELLS INDIVIDUALLY COMPRISING A PROGRAMMABLE CHARGE-STORAGE TRANSISTOR

(71) Applicant: Micron Technology, Inc., Boise, ID (US)

(72) Inventors: Wei Yeeng Ng, Boise, ID (US); Ian Laboriante, Boise, ID (US); Joseph Neil Greeley, Boise, ID (US); Tom J. John, Boise, ID (US); Ho Yee Hui, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 15/903,254

(22) Filed: Feb. 23, 2018

(65) Prior Publication Data
US 2019/0206884 A1 Jul. 4, 2019

Related U.S. Application Data

(60) Provisional application No. 62/611,136, filed on Dec. 28, 2017.

(51) Int. Cl.
*H01L 27/115* (2017.01)
*H01L 27/11556* (2017.01)
(Continued)

(52) U.S. Cl.
CPC ... *H01L 27/11556* (2013.01); *H01L 21/31111* (2013.01); *H01L 21/31133* (2013.01);
(Continued)

(58) Field of Classification Search
CPC ....... H01L 2924/00; H01L 2224/32225; H01L 2224/48227; H01L 2224/73265; H01L 27/11582
See application file for complete search history.

(56) References Cited

U.S. PATENT DOCUMENTS

| 2014/0264533 A1* | 9/2014 | Simsek-Ege ........ H01L 27/1158 257/316 |
|---|---|---|
| 2019/0103410 A1 | 4/2019 | Daycock et al. |

* cited by examiner

*Primary Examiner* — Tony Tran
(74) *Attorney, Agent, or Firm* — Wells St. John P.S.

(57) ABSTRACT

A method of forming an array of elevationally-extending strings of memory cells comprises forming a stack comprising alternating insulative tiers and wordline tiers. A select gate tier is above an upper of the insulative tiers. Channel openings extend through the alternating tiers and the select gate tier. Charge-storage material is formed within the channel openings elevationally along the alternating tiers and the select gate tier. Sacrificial material is formed within the channel openings laterally over the charge-storage material that is laterally over the select gate tier and that is laterally over the alternating tiers. Elevationally-outer portions of each of the charge-storage material and the sacrificial material that are within the channel openings are etched. After such etching, the sacrificial material is removed from the channel openings. After such removing, insulative charge-passage material then channel material are formed within the channel openings laterally over the charge-storage material that is laterally over the wordline tiers. The wordline tiers are formed to comprise control-gate material having terminal ends corresponding to control-gate regions of individual memory cells and to have a charge-blocking region of the individual memory cells laterally between the charge-storage material and individual of the control-gate regions.

25 Claims, 7 Drawing Sheets

(51) Int. Cl.
*H01L 27/11524* (2017.01)
*H01L 27/1157* (2017.01)
*H01L 27/11582* (2017.01)
*H01L 23/522* (2006.01)
*H01L 21/3213* (2006.01)
*H01L 21/311* (2006.01)
*H01L 21/768* (2006.01)
*H01L 21/28* (2006.01)

(52) U.S. Cl.
CPC .. *H01L 21/31138* (2013.01); *H01L 21/32134* (2013.01); *H01L 21/32135* (2013.01); *H01L 21/76877* (2013.01); *H01L 23/5226* (2013.01); *H01L 27/1157* (2013.01); *H01L 27/11524* (2013.01); *H01L 27/11582* (2013.01); *H01L 29/40114* (2019.08); *H01L 29/40117* (2019.08)

METHODS OF FORMING AN ARRAY OF ELEVATIONALLY-EXTENDING STRINGS OF MEMORY CELLS INDIVIDUALLY COMPRISING A PROGRAMMABLE CHARGE-STORAGE TRANSISTOR

TECHNICAL FIELD

Embodiments disclosed herein pertain to methods of forming an array of elevationally-extending strings of memory cells individually comprising a programmable charge-storage transistor.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor.

DETAILED DESCRIPTION OF EXAMPLE EMBODIMENTS

First example embodiments of a method of forming an array of elevationally-extending (e.g., vertical and/or within 10° of vertical) strings of memory cells individually comprising a programmable charge-storage transistor are described with reference to FIGS. 1-8.

Figure 1:
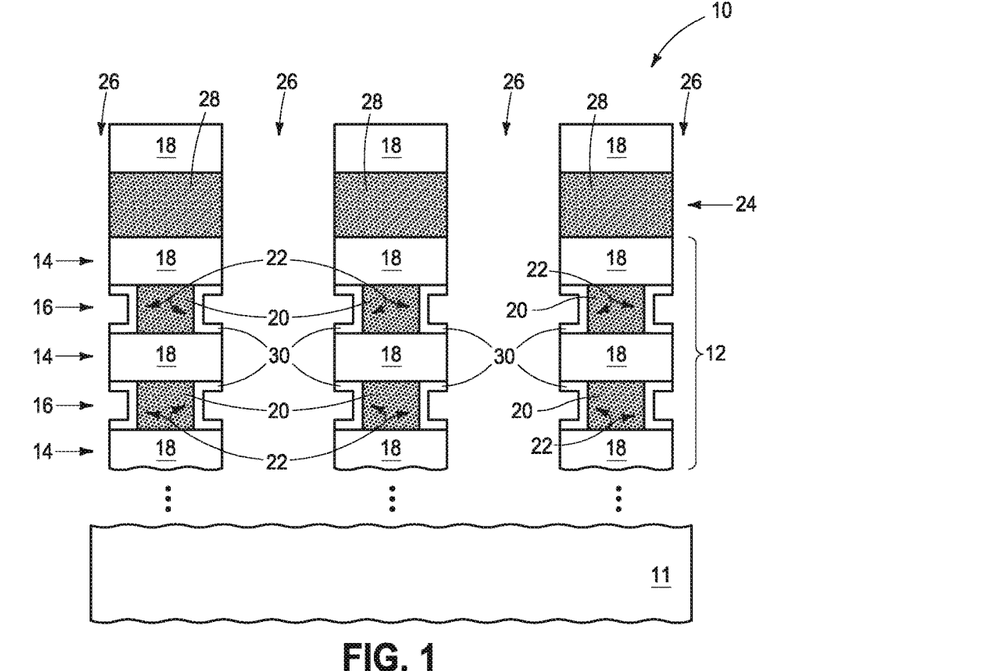
FIG. 1 is a diagrammatic cross-sectional view of a substrate construction in process in accordance with an embodiment of the invention.

Referring to FIG. 1, a construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. In this document, a "sub-array" may also be considered as an array.

A stack 12 has been formed over base substrate 11, and comprises alternating insulative tiers 14 and wordline tiers 16. For simplicity and ease of depiction, only a few alternating tiers 14, 16 are shown, with likely dozens, hundreds, etc. being formed above example base substrate 11. Insulative tiers 14 are shown as comprising insulative material 18 (e.g., silicon dioxide and/or silicon nitride) and wordline tiers 16 are shown as comprising control-gate material 20 (conductive material, for example comprising metal material and/or conductively-doped semiconductive material such as conductively-doped polysilicon). Control-gate material 20 has terminal ends 22 corresponding to control-gate regions of individual memory cells that are being formed. A select gate tier 24 is above an upper (e.g., an uppermost) of insulative tiers 14. Select gate tier 24 comprises select gate material 28, for example conductively-doped semiconductive material and/or metal material that may be of the same composition or of different composition from that of control-gate material 20. Channel openings 26 have been formed to extend through alternating tiers 14, 16 and select gate tier 24. Charge-blocking material 30 (e.g., comprising a composite of silicon dioxide/silicon nitride/silicon dioxide having an example thickness of 25 to 80 Angstroms) has been formed within channel openings 26.

An example technique for forming construction 10 includes forming channel openings 26 through stack 12 (including select gate material 28 and insulative material 18 there-atop), followed by laterally recessing (e.g., by wet or dry etching) of control-gate material 20. This may be followed by conformal deposition of charge-blocking material 30 followed by, for example, removal (e.g., by wet or dry etching) of material 30 from being laterally aside and atop insulative material 18. Select gate material 28 may be shielded from being laterally recessed when control-gate material 20 is laterally recessed, if desired, for example if materials 20 and 28 are of the same composition or are of etchably similar compositions if of different compositions.

Figure 2:
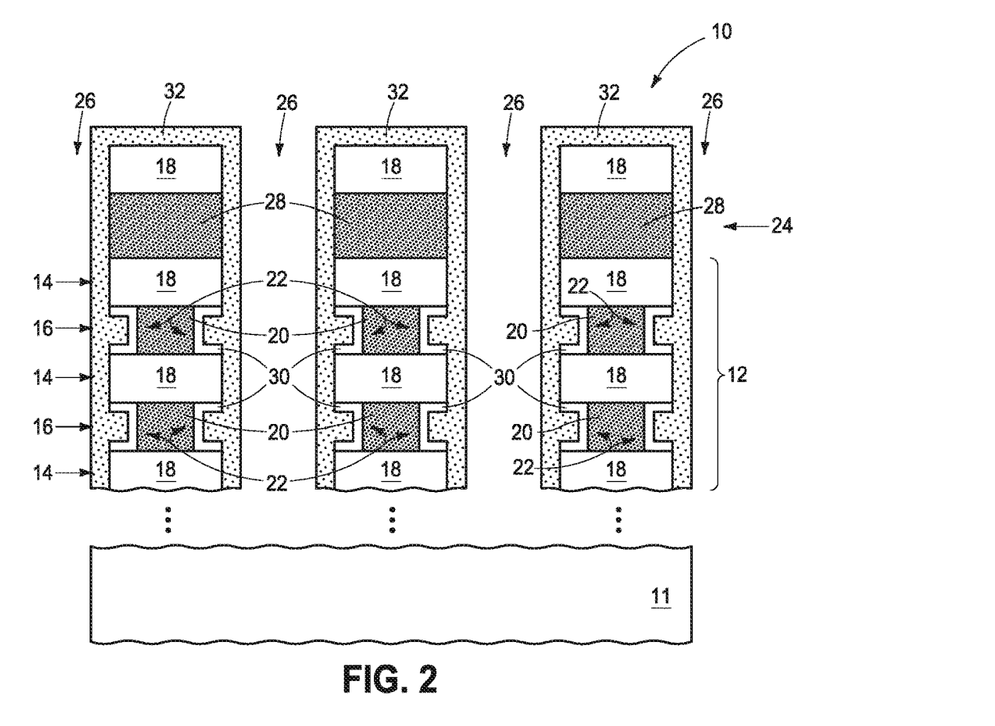
FIG. 2 is a view of the FIG. 1 construction at a processing step subsequent to that shown by FIG. 1.

Referring to FIG. 2, charge-storage material 32 has been formed within channel openings 26 elevationally along alternating tiers 14, 16 and select gate tier 24. Charge-storage material 32 may comprise any suitable composition(s) and, in some embodiments, may comprise floating-gate material (e.g., doped or undoped silicon) or charge-trapping material (e.g., silicon nitride, metal dots, etc.). In some embodiments, charge-storage material 32 may comprise, consist essentially of, or consist of doped or undoped polysilicon. Regardless, an example thickness of charge-storage material 32 is 50 to 80 Angstroms.

A charge-blocking region of the individual memory cells is ultimately, laterally between charge-storage material 32 and individual of the control-gate regions (e.g., terminal ends 22 of control-gate material 20). In one embodiment and as shown, such charge-blocking regions individually comprise charge-blocking material 30. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 30. By way of further examples, a charge-blocking region may comprise a laterally (e.g., radially) outer portion of the charge-storage material (e.g., material 32) where such charge-storage material is insulative (e.g., in the absence of any different-composition material between an insulative-charge-storage material 32 and control-gate material 20). Regardless, as an additional example, an interface of a charge-storage material and conductive material of a control gate may be sufficient to function as a charge-blocking region in the absence of any separate-composition insulator material 30. Further, an interface of control-gate material 20 with material 30 (when present) in combination with insulator material 30 may together function as a charge-blocking region, and as alternately or additionally may a laterally-outer region of an insulative-charge-storage material (e.g., a silicon nitride material 32).

Figure 3:
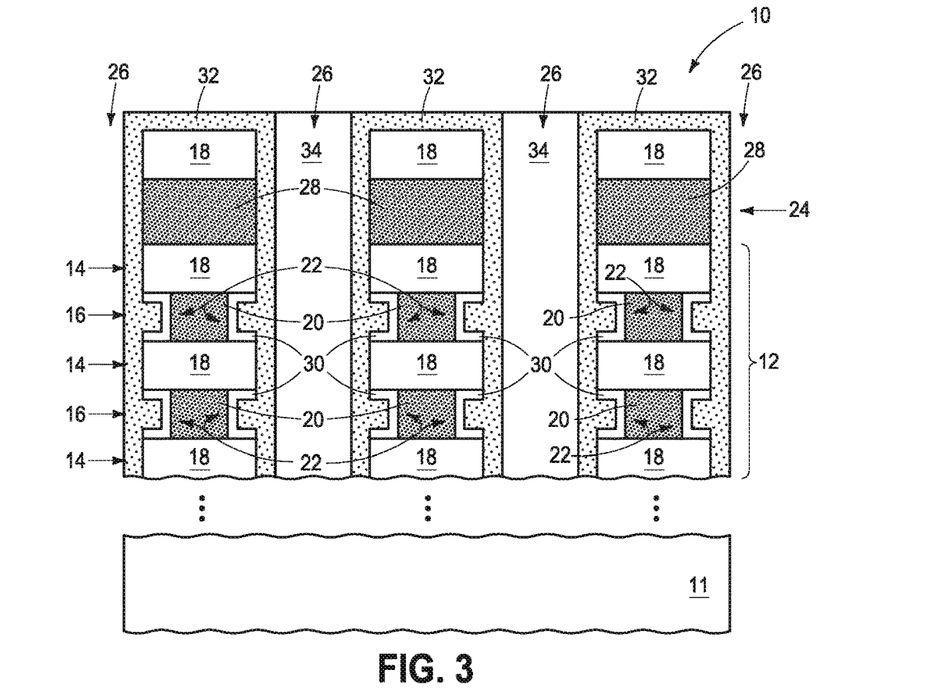
FIG. 3 is a view of the FIG. 2 construction at a processing step subsequent to that shown by FIG. 2.

Referring to FIG. 3, sacrificial material 34 has been formed within channel openings 26 laterally over charge-storage material 32 that is laterally over select gate tier 24 and that is laterally over alternating tiers 14, 16. An example technique of doing so comprises deposition of sacrificial material 34 followed by polishing (e.g., chemical mechanical polishing) to remove it from being atop charge-storage material 32. In one embodiment, sacrificial material 34 comprises carbon. In one such embodiment, sacrificial material 34 comprises, consists essentially of, or consists of photoresist. In one embodiment, sacrificial material 34 consists essentially of elemental-form carbon (e.g., amorphous, graphitic, diamond, etc.). By way of examples only, additional carbon-comprising sacrificial material 34 includes carbon-containing antireflective coatings, carbon-containing polymers, solid hydrocarbons, and materials comprising one or more hydrocarbon-containing moiety(ies).

Figure 4:
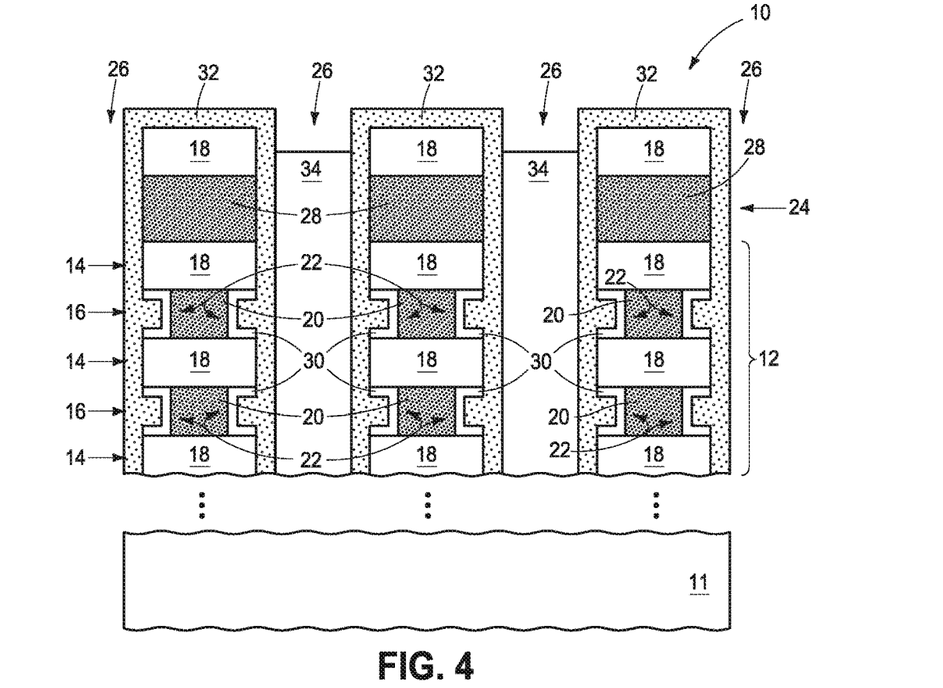
FIG. 4 is a view of the FIG. 3 construction at a processing step subsequent to that shown by FIG. 3.

Referring to FIG. 4, sacrificial material 34 has been etched selectively relative to charge-storage material 32 to elevationally recess sacrificial material 34 relative thereto. An example technique for such etching where sacrificial material 34 comprises photoresist and charge-storage material 32 comprises poly-silicon includes plasma etching with substrate temperature of 50° C. to 300° C., chamber pressure of 0.1 to 2 Torr, gas flow rate of $NH_3$ of 500 to 3,000 sccm, gas flow rate of a mixture of $H_2$ and $N_2$ (forming gas) of 500 to 3,000 sccm, power from 1,500-4,500 watts, and an etching time from 1 second to 100 seconds. Oxygen ($O_2$ and/or $O_3$) and/or forming gas may alternately be used without plasma.

Figure 5:
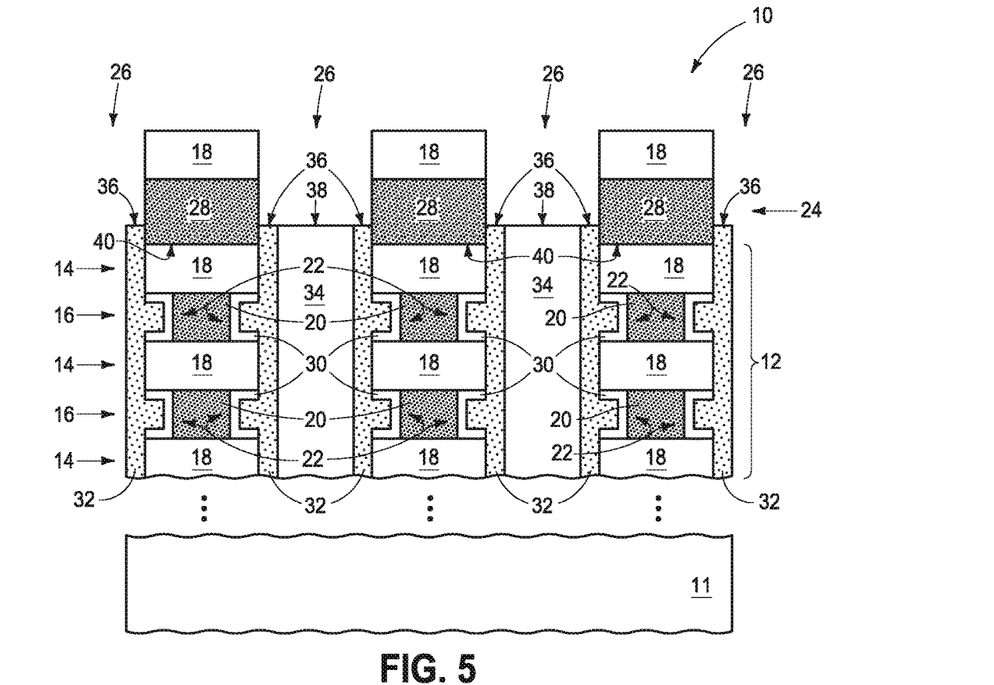
FIG. 5 is a view of the FIG. 4 construction at a processing step subsequent to that shown by FIG. 4.

Referring to FIG. 5, a first etching has been conducted which comprises etching elevationally-outer portions (in one embodiment elevationally-outermost portions) of each of charge-storage material 32 and sacrificial material 34 that are within channel openings 26 in at least one common etching step. In the context of this document, "common" and "commonly" as respects an act of etching etches each of charge-storage material 32 and sacrificial material 34 at the same time (i.e., over at least some same time period) at a removal rate of at least 20 Angstroms/second each, but not necessarily at the same removal rate. In this document, a "same removal rate" is a rate that removes both charge-storage material 32 and sacrificial material 34 at respective removal rates that differ no more than 5 Angstroms/second, including exactly at the same removal rate (i.e., no difference in removal rate, meaning removal rate variance of 0 Angstroms/second between the two). Further, references are made herein to "first etching" and "second etching", with such only meaning temporally relative one another such that the "second etching" occurs after the "first etching". However, such does not preclude etching of the same or different stated material(s) before or after the first etching, before or after the second etching, and/or including between the stated first etching and the stated second etching.

In one embodiment and as shown in FIG. 5, such etching forms or leaves uppermost tops 36 of charge-storage material 32 and uppermost tops 38 of sacrificial material 34 within channel openings 26 above bottoms 40 of select gate tier 24. In one such embodiment and as shown, uppermost tops 36, 38 within individual channel openings 26 are elevationally coincident and in one such embodiment are horizontally planar. Regardless, a native oxide (if any) may be removed by exposure to HF prior to starting the first etching, if desired.

In one embodiment, the example FIG. 5 etching step comprises vapor phase etching (i.e., at least some portion of which is conducted in the absence of liquid phase). As one such example (with or without plasma) where charge-storage material 32 comprises polysilicon and sacrificial material 34 comprises photoresist, temperature is 50° C. to 200° C.; chamber pressure is 0.1 to 10 Torr; $NF_3$, $SF_6$, $CF_4$, and/or $F_2$ flow each is 10 to 500 sccm; $H_2$ flow is 0 to 3,000 sccm; He flow is 1,000 to 3,000 sccm; Ar flow is 0 to 500 sccm; and such parameters occur for 80 to 200 seconds. In one embodiment, the vapor phase etching uses only $NF_3$ as a chemically-active etching component.

A reason for conducting the example FIG. 4-depicted selective etch of material 34 relative to material 32 is where material 34 and material 32 do not etch at the same removal rate or at the exact same removal rate and a structure as or similar to that shown in FIG. 5 is desired.

The structure of FIG. 5 may be subjected to an oxide etch, a nitride etch, and/or a charge-storage material etch, for example to remove any remaining/residual/remnant (not shown) charge-storage material 32 or reaction-product thereof that might be laterally over the depicted sidewalls of select gate material 28 above tops 38. For example, some of charge-storage material 32 may oxidize into silicon dioxide that may be removed by a fluorine-containing etchant (e.g., dilute HF and/or $NH_4F$). Additionally and/or alternately, remaining elemental-form silicon charge-storage material 32 (if any, and not shown) over such sidewalls may be etched away with an ammonium hydroxide. Additionally and/or alternately, remaining silicon nitride material over such sidewalls (if any, and not shown) may be etched away with phosphoric acid.

Figure 6:
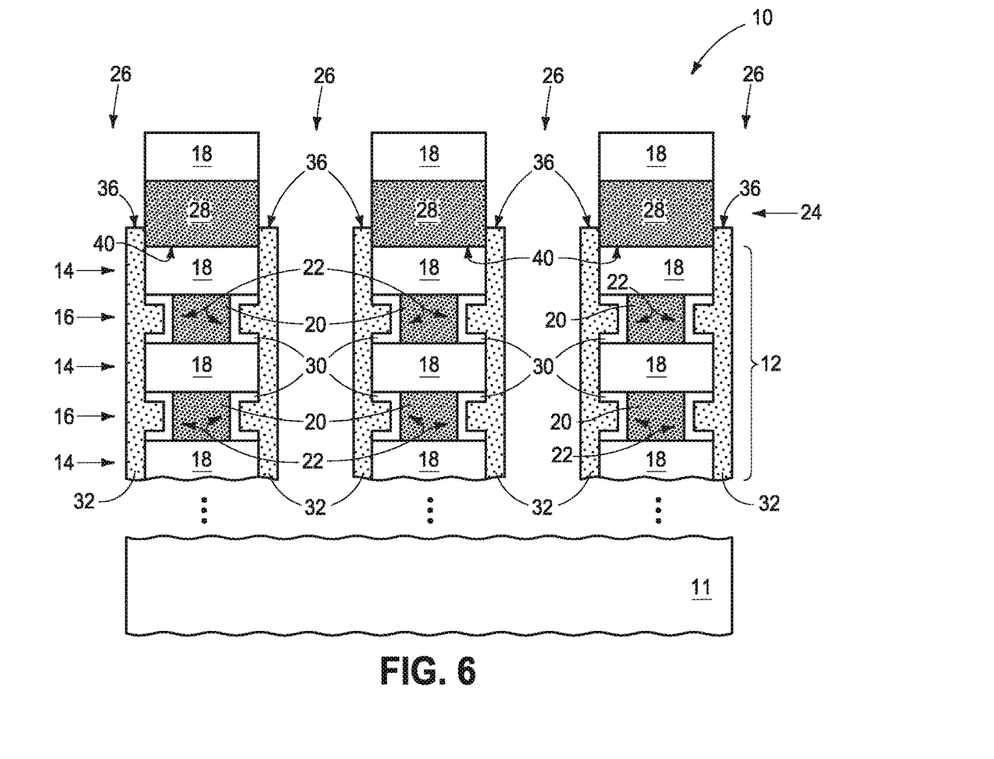
FIG. 6 is a view of the FIG. 5 construction at a processing step subsequent to that shown by FIG. 5.

Referring to FIG. 6, remaining of sacrificial material 34 (not shown) has been removed from channel openings 26, and in one embodiment and as shown wherein such act of removing removes all remaining sacrificial material 34 (again, none being shown in FIG. 6) from channel openings 26. Such act of removing may occur, for example, by wet and/or dry etching (e.g., vapor phase) of sacrificial material 34 selectively relative to other exposed materials. For example, where material 34 comprises photoresist, materials 32 and 28 comprise elemental-form silicon, and material 18 comprises silicon dioxide, an example wet etching chemistry includes a combination of sulphuric acid and hydrogen peroxide. Example dry etching chemistries include $O_2$ (alone or in combination with forming gas) and/or $NH_3$, and with or without plasma. Example other conditions during any such removal are substrate temperature of 25° C. to 50° C., any suitable pressure, and an example time of etching of 10 seconds to 30 minutes.

Figure 7:
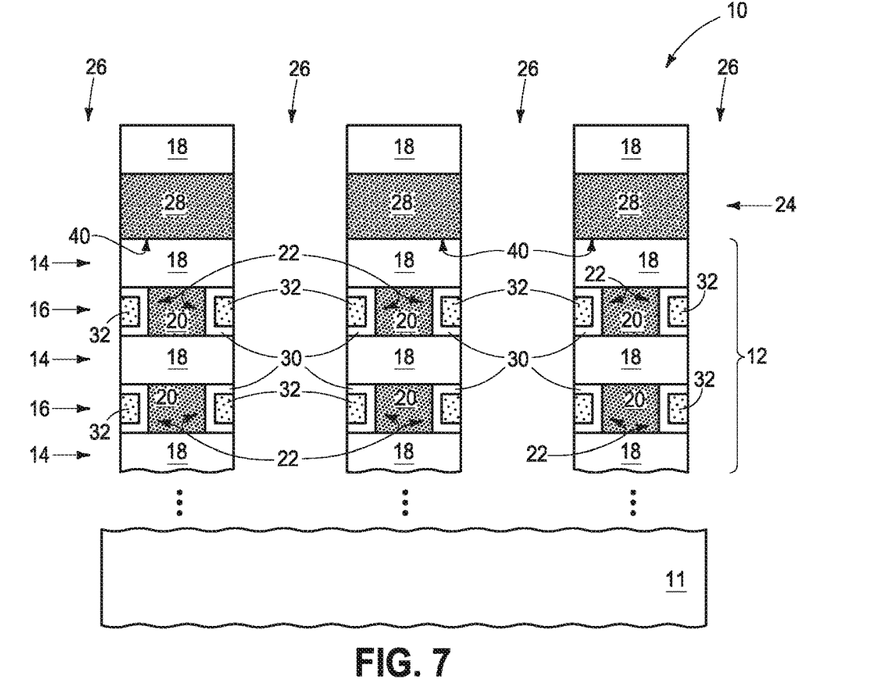
FIG. 7 is a view of the FIG. 6 construction at a processing step subsequent to that shown by FIG. 6.

Referring to FIG. 7 and after removing of sacrificial material 34 as shown and described above with respect to FIG. 6, second etching has been conducted which comprises etching charge-storage material 32 within channel openings 26 that is below (i.e., at least that which is below) select gate tier 24. In one example embodiment where charge-storage material 32 comprises elemental-form silicon, an example etching chemistry is wet (i.e., at least some portion of which is conducted in the liquid phase), such as using liquid potassium hydroxide or a liquid ammonium hydroxide at a temperature of 25° C. to 50° C., any suitable pressure, and an example time of etching of 10 to 120 seconds. Alternately, any existing or future-developed dry etching chemistry may be used.

Figure 8:
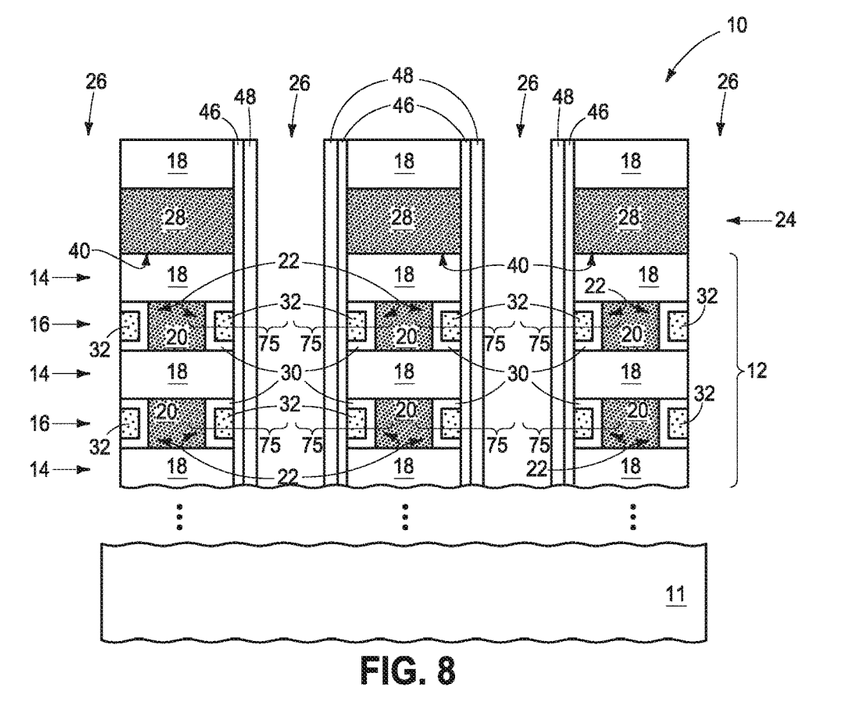
FIG. 8 is a view of the FIG. 7 construction at a processing step subsequent to that shown by FIG. 7.

Referring to FIG. 8, insulative charge-passage material 46 (e.g., a gate insulator) then channel material 48 have been formed within channel openings 26 laterally over charge-storage material 32 that is laterally over wordline tiers 16, thus forming individual memory cells 75. Charge-passage material 46 may be, by way of example, a bandgap-engineered structure having nitrogen-containing material (e.g., silicon nitride) sandwiched between two insulator oxides (e.g., silicon dioxide). An example thickness of charge-passage material 46 is 25 to 80 Angstroms. Example channel materials 48 include undoped or appropriately-doped crystalline semiconductor material, such as one or more of silicon, germanium and so-called III/V semiconductor materials (e.g., GaAs, InP, GaP, and/or GaN). Channel material 48 is shown as being deposited to form what is commonly referred to as a "hollow channel", and which has been subsequently filled with dielectric material 50 (e.g., silicon dioxide and/or silicon nitride). Alternately, and by of example only, channel material 48 may completely fill (not shown) remaining volume of channel openings 26.

Any other attribute(s) or aspect(s) as shown and/or described herein with respect to other embodiments may be used with respect to the above-described embodiments.

Alternate example embodiments are next described with reference to FIGS. 9-13. Like numerals from the above-described embodiments have been used where appropriate, with some construction differences being indicated with the suffix "a", the suffix "b", and/or different numerals.

Figure 9:
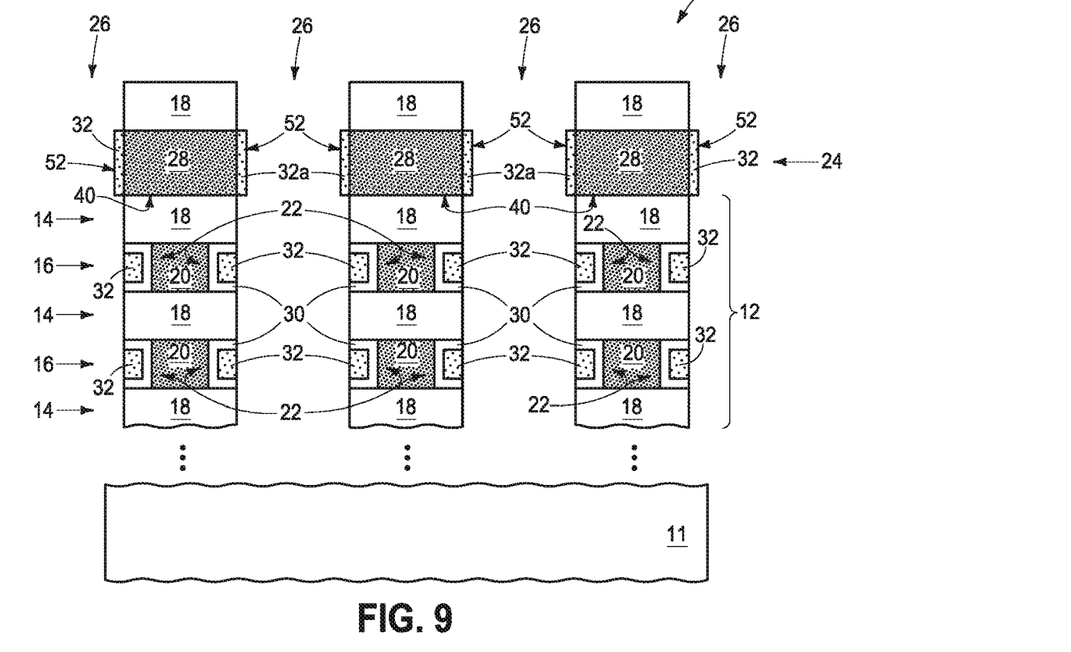
FIG. 9 is a diagrammatic cross-sectional view of a substrate construction in process in accordance with an embodiment of the invention.

Referring to FIG. 9, an alternate embodiment substrate construction 10a is shown depicting alternate processing of the above-described FIG. 2 substrate in comparison to that shown by FIG. 3. Specifically, a first etching has been conducted that comprises etching charge-storage material 32 within channel openings 26 below (i.e., at least below) select gate tier 24. Example techniques of etching charge-storage material 32 include any of those described above. Regardless, such first etching is shown as leaving remnant charge-storage material 32a within channel openings 26 laterally over select gate tier 24. In one embodiment and as shown, such act of first etching leaves remnant charge-storage material 32a that is laterally over select gate tier 24 within channel openings 26 as an elevationally-continuous layer 52 laterally over select gate tier 24 in at least one vertical cross-section (e.g., the cross-section shown by FIG. 9). Alternately, for example as shown with respect to a construction 10b in FIG. 10, such first etching may leave remnant charge-storage material 32b within channel openings 26 as an elevationally-discontinuous layer 52b laterally over select gate tier 24 in at least one vertical cross-section.

Figure 10:
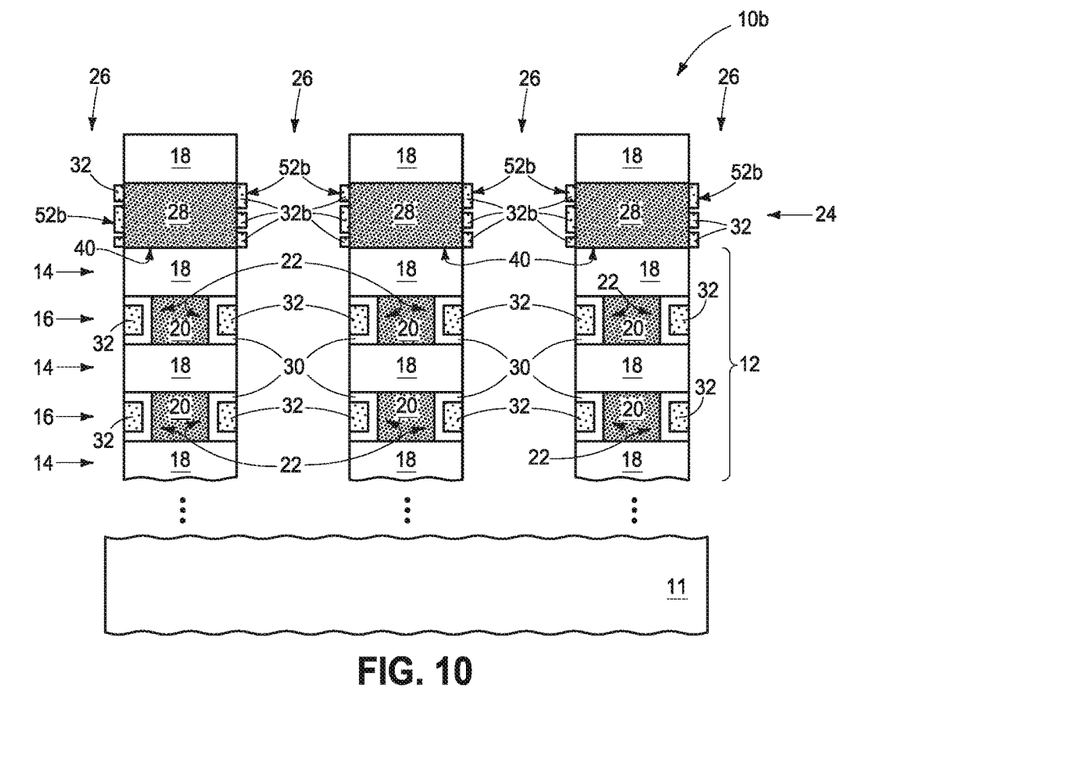
FIG. 10 is a diagrammatic cross-sectional view of a substrate construction in process in accordance with an embodiment of the invention.
Figure 11:
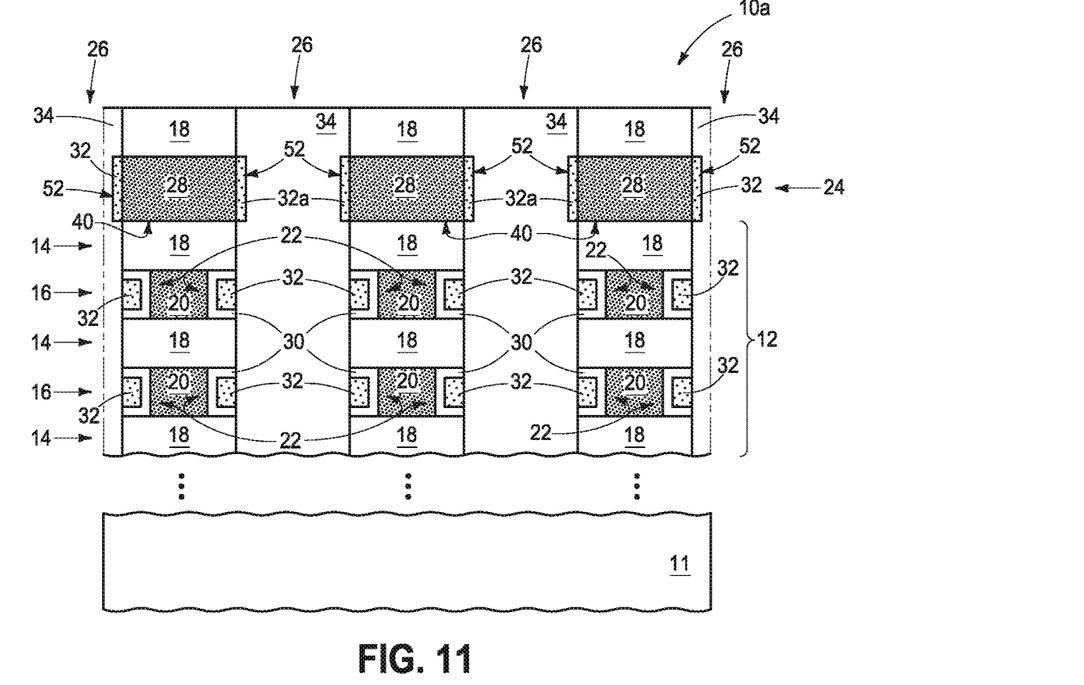
FIG. 11 is a view of the FIG. 9 construction at a processing step subsequent to that shown by FIG. 9.

Regardless, after such first etching as depicted in either FIG. 9 or 10 by way of examples, and referring to FIG. 11, sacrificial material 34 has been formed within channel openings 26 laterally over the remnant charge-storage material (32a in FIG. 11) that is laterally over select gate tier 24 and laterally over charge-storage material 32 that is below select gate tier 24 after the first etching.

Figure 12:
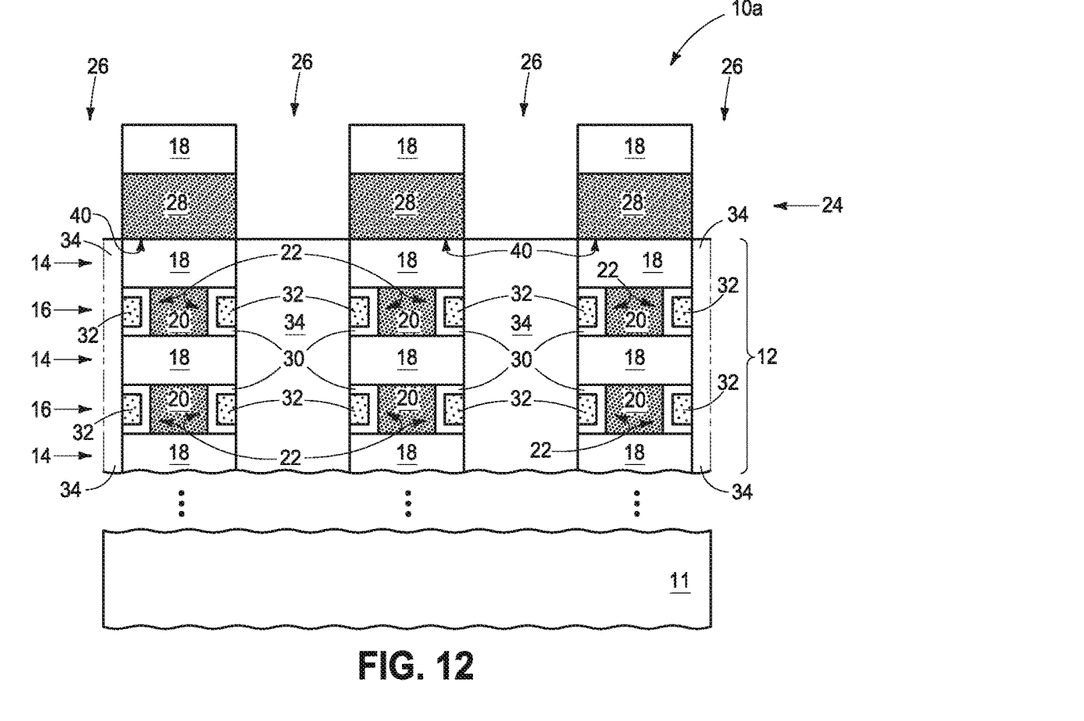
FIG. 12 is a view of the FIG. 11 construction at a processing step subsequent to that shown by FIG. 11.

Referring to FIG. 12, second etching has been conducted which comprises etching the remnant charge-storage material (not shown) that is laterally over select gate tier 24 and sacrificial material 34 within channel openings 26 in at least in one common etching step, with such common etching step removing all remaining of the remnant charge-storage material from being laterally over select gate tier 24.

Figure 13:
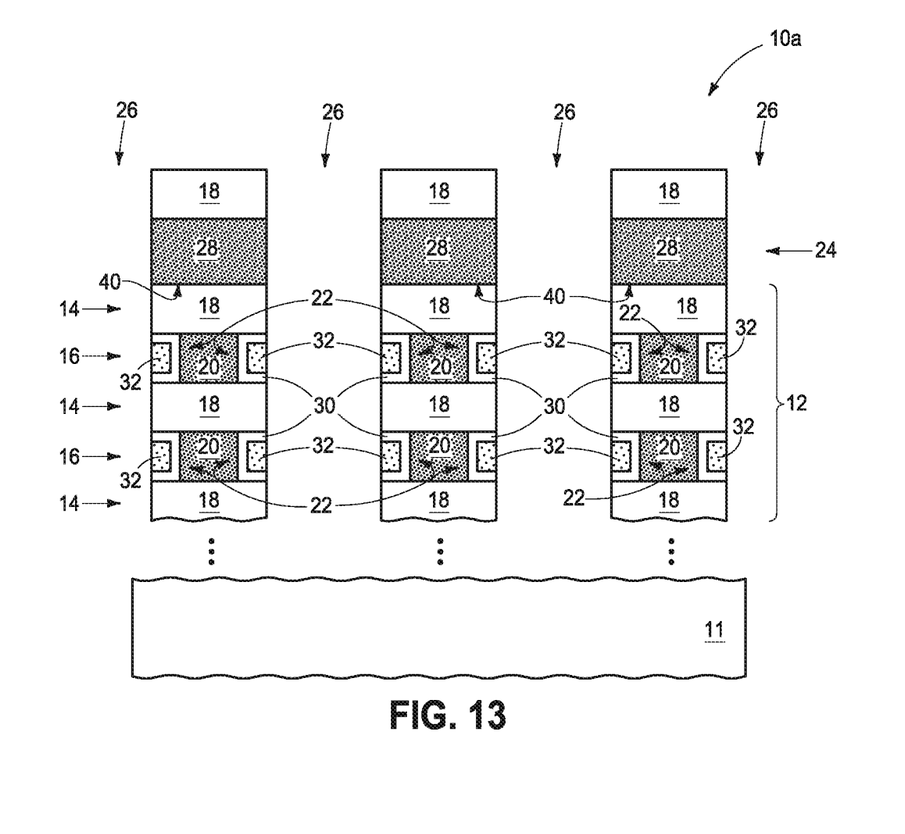
FIG. 13 is a view of the FIG. 12 construction at a processing step subsequent to that shown by FIG. 12.

Referring to FIG. 13, and after the second etching as shown and described above with respect to FIG. 12, remaining (in one embodiment all) of sacrificial material 34 (not shown) has been removed from channel openings 26. Subsequent processing may occur, for example as shown and described above with respect to FIG. 8.

Any other attribute(s) or aspect(s) as shown and/or described herein with respect to other embodiments may be used.

The above example embodiments by way example only are shown and basically described with reference to what is commonly referred to as "gate-first" processing. Other existing or future-developed processing may also and/or alternately be used, for example so-called "gate-last" or "replacement-gate" processing.

Regardless, an embodiment of the invention comprises forming a stack (e.g., 12) comprising alternating insulative tiers (e.g., 14) and wordline tiers (e.g., 16), with a select gate tier (e.g., 24) being above an upper of the insulative tiers. Channel openings (e.g., 26) extend through the alternating tiers and the select gate tier. Charge-storage material (e.g., 32) is formed within the channel openings elevationally along the alternating tiers and the select gate tier. Sacrificial material (e.g., 34) is formed within the channel openings laterally over the charge-storage material that is laterally over the select gate tier and that is laterally over the alternating tiers. Elevationally-outer portions of each of the charge-storage material and the sacrificial material that are within the channel openings are etched (e.g., regardless of whether gate-first or gate-last). After such etching, the sacrificial material is removed from the channel openings. After such removing, insulative charge-passage material (e.g., 46) then channel material (e.g., 48) are formed within the channel openings laterally over the charge-storage material that is laterally over the wordline tiers. The wordline tiers are formed to comprise control-gate material (e.g., 20) having terminal ends (e.g., 22) corresponding to control-gate regions of individual memory cells (e.g., 75) and to have a charge-blocking region (e.g., material 30) of the individual memory cells laterally between the charge-storage material and individual of the control-gate regions (i.e., and again, regardless of whether gate-first, gate-last, or other processing).

In one embodiment, the etching comprises a vapor phase etching step that commonly etches each of the charge-storage material and the sacrificial material that is within the channel openings. In one such embodiment, wet etching is conducted of the charge-storage material within the channel openings, in one embodiment before the vapor phase etching (e.g., in the embodiment shown by FIGS. 1-8) and in one embodiment after the vapor phase etching (e.g., in the embodiment shown by FIGS. 9-13).

Any other attribute(s) or aspect(s) as shown and/or described herein with respect to other embodiments may be used.

By way of examples only, elemental-form silicon (e.g., polysilicon) as charge-storage material may be etched using $NF_3$ and $H_2$, for example along a likely or at least possible fluorine-radical-using reaction pathway, as follows:

$$NF_{3(g)} \rightarrow NF_x^* + F^* \text{ (gas, plasma)}$$

$$F^* + H_{2(g)} \rightarrow H^* + H_xF_y^* \text{ (gas phase)}$$

$$Si_{(s)} + H^* \rightarrow SiH^*_{(surface)} \text{ (surface reaction)}$$

$$SiH^*_{(surface)} + H_xF_y^* \rightarrow SiF_{x(g)} + H_{2(g)} \text{ (surface reaction)}$$

$$SiH^*_{(surface)} + NF_x^* \rightarrow SiF_{x(g)} + NH_{3(g)} \text{ (surface reaction)}$$

$$Si_{(s)} + F^* \rightarrow SiF_{x(g)} \text{ (surface reaction)}$$

However, and regardless, etch rate of elemental-form silicon within high aspect ratio openings typically decays with depth presumably due to reactant concentration depletion. Use of a sacrificial material aside elemental-form silicon may enable a more uniform and controllable etch of such elemental-form silicon particularly where the sacrificial material and elemental-form silicon can be etched at the same time and at about the same rate using a common etching chemistry. While the invention may have been motivated in achieving this result, it is in no way so limited unless a claim is expressly literally so limited.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

In this document, "selective" as to etch, etching, removing, removal, forming, and/or formation is such an act of one stated material relative to another stated material(s) so acted upon at a rate of at least 2:1 by volume.

CONCLUSION

In some embodiments, a method of forming an array of elevationally-extending strings of memory cells, with the memory cells individually comprising a programmable charge-storage transistor, comprises forming a stack comprising alternating insulative tiers and wordline tiers. A select gate tier is above an upper of the insulative tiers. Channel openings extend through the alternating tiers and the select gate tier. Charge-storage material is formed within the channel openings elevationally along the alternating tiers and the select gate tier. Sacrificial material is formed within the channel openings laterally over the charge-storage material that is laterally over the select gate tier and that is laterally over the alternating tiers. Elevationally-outer portions of each of the charge-storage material and the sacrificial material that are within the channel openings are etched. After such etching, the sacrificial material is removed from the channel openings. After such removing, insulative charge-passage material then channel material are formed within the channel openings laterally over the charge-storage material that is laterally over the wordline tiers. The wordline tiers are formed to comprise control-gate material having terminal ends corresponding to control-gate regions of individual memory cells and to have a charge-blocking region of the individual memory cells laterally between the charge-storage material and individual of the control-gate regions.

In some embodiments, a method of forming an array of elevationally-extending strings of memory cells, with the memory cells individually comprising a programmable charge-storage transistor, comprises forming a stack comprising alternating insulative tiers and wordline tiers. A select gate tier is above an upper of the insulative tiers. Channel openings extend through the alternating tiers and the select gate tier. Charge-storage material is formed within the channel openings elevationally along the alternating tiers and the select gate tier and a charge-blocking region of the individual memory cells is formed laterally between the charge-storage material and individual of the control-gate regions. First etching is conducted that comprises etching the charge-storage material within the channel openings below the select gate tier. The first etching leaves remnant charge-storage material within the channel openings laterally over the select gate tier. After the first etching, sacrificial material is formed within the channel openings laterally over the remnant charge-storage material that is laterally over the select gate tier and laterally over the charge-storage material that is below the select gate tier. Second etching is conducted that comprises etching the remnant charge-storage material that is laterally over the select gate tier and the sacrificial material within the channel openings in at least one common etching step, with the common etching step removing all remaining of the remnant charge-storage material from being laterally over of the select gate tier. After the second etching, remaining of the sacrificial material is removed from the channel openings. After removing remaining of the sacrificial material from the channel openings, insulative charge-passage material then channel material are formed within the channel openings laterally over the charge-storage material that is laterally over the wordline tiers.

In some embodiments, a method of forming an array of elevationally-extending strings of memory cells, with the memory cells individually comprising a programmable charge-storage transistor, comprises forming a stack comprising alternating insulative tiers and wordline tiers. A select gate tier is above an upper of the insulative tiers. Channel openings extend through the alternating tiers and the select gate tier. Charge-storage material is formed within the channel openings elevationally along the alternating tiers and the select gate tier and a charge-blocking region of the individual memory cells is formed laterally between the charge-storage material and individual of the control-gate regions. Sacrificial material is formed within the channel openings laterally over the charge-storage material that is laterally over the select gate tier and that is laterally over the alternating tiers. First etching is conducted that comprises etching elevationally-outer portions of each of the charge-storage material and the sacrificial material that are within the channel openings in at least one common etching step. After the first etching, remaining of the sacrificial material is removed from the channel openings. After such removing, second etching is conducted that comprises etching the charge-storage material within the channel openings that is below the select gate tier. After the second etching, insulative charge-passage material then channel material are formed within the channel openings laterally over the charge-storage material that is laterally over the wordline tiers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of elevationally-extending strings of memory cells, the memory cells individually comprising a programmable charge-storage transistor, the method comprising:
    forming a stack comprising alternating insulative tiers and wordline tiers, a select gate tier being above an upper of the insulative tiers, channel openings extending through the alternating tiers and the select gate tier;
    forming charge-storage material within the channel openings elevationally along the alternating tiers and the select gate tier;
    forming sacrificial material within the channel openings laterally over the charge-storage material that is laterally over the select gate tier and that is laterally over the alternating tiers;
    etching elevationally-outer portions of each of the charge-storage material and the sacrificial material that are within the channel openings;
    after the etching, removing the sacrificial material from the channel openings;
    after the removing, forming insulative charge-passage material then channel material within the channel openings laterally over the charge-storage material that is laterally over the wordline tiers; and
    forming the wordline tiers to comprise control-gate material having terminal ends corresponding to control-gate regions of individual memory cells and having a charge-blocking region of the individual memory cells laterally between the charge-storage material and individual of the control-gate regions.

2. The method of claim 1 wherein the charge-storage material comprises polysilicon.

3. The method of claim 1 wherein the sacrificial material comprises carbon.

4. The method of claim 3 wherein the sacrificial material comprises photoresist.

5. The method of claim 3 wherein the sacrificial material consists essentially of elemental-form carbon.

6. The method of claim 1 wherein the removing removes all remaining of the sacrificial material from the channel openings.

7. The method of claim 1 wherein the etching comprises an etching step that commonly etches each of the charge-storage material and the sacrificial material that are within the channel openings.

8. The method of claim 7 wherein the etching step etches each of the charge-storage material and the sacrificial material that are within the channel openings at the same removal rate.

9. The method of claim 7 comprising, before the etching step, etching the sacrificial material selectively relative to the charge-storage material to elevationally recess the sacrificial material relative to the charge-storage material.

10. The method of claim 7 wherein the etching step comprises vapor phase etching.

11. The method of claim 10 comprising wet etching the charge-storage material within the channel openings.

12. The method of claim 11 wherein the wet etching occurs before the vapor phase etching.

13. The method of claim 11 wherein the wet etching occurs after the vapor phase etching.

14. The method of claim 10 wherein the vapor phase etching uses only $NF_3$ as a chemically-active etching component.

15. The method of claim 1 wherein the etching leaves uppermost tops of the charge-storage material and of the sacrificial material within the channel openings above bottoms of the select gate tier.

16. The method of claim 15 wherein said uppermost tops within individual of the channel openings are elevationally coincident.

17. The method of claim 16 wherein said uppermost tops within the individual channel openings are horizontally planar.

18. The method of claim 1 wherein the elevationally-extending strings are vertical or within 10° degrees of vertical.

19. A method of forming an array of elevationally-extending strings of memory cells, the memory cells individually comprising a programmable charge-storage transistor, the method comprising:
    forming a stack comprising alternating insulative tiers and wordline tiers, the wordline tiers comprising control-gate material having terminal ends corresponding to control-gate regions of individual memory cells, a select gate tier being above an upper of the insulative tiers, channel openings extending through the alternating tiers and the select gate tier;
    forming charge-storage material within the channel openings elevationally along the alternating tiers and the select gate tier and forming a charge-blocking region of the individual memory cells laterally between the charge-storage material and individual of the control-gate regions;
    first etching comprising etching the charge-storage material within the channel openings below the select gate tier, the first etching leaving remnant charge-storage material within the channel openings laterally over the select gate tier;
    after the first etching, forming sacrificial material within the channel openings laterally over the remnant charge-storage material that is laterally over the select gate tier and laterally over the charge-storage material that is below the select gate tier;
    second etching comprising etching the remnant charge-storage material that is laterally over the select gate tier and the sacrificial material within the channel openings in at least one common etching step, the common etching step removing all remaining of the remnant charge-storage material from being laterally over of the select gate tier;
    after the second etching, removing remaining of the sacrificial material from the channel openings; and
    after removing remaining of the sacrificial material from the channel openings, forming insulative charge-passage material then channel material within the channel openings laterally over the charge-storage material that is laterally over the wordline tiers.

20. The method of claim 19 wherein the first etching leaves the remnant charge-storage material within the channel openings as an elevationally-continuous layer laterally over the select gate tier in at least one vertical cross-section.

21. The method of claim 19 wherein the first etching leaves the remnant charge-storage material within the channel openings as an elevationally-discontinuous layer laterally over the select gate tier in at least one vertical cross-section.

22. The method of claim 19 wherein the removing remaining of the sacrificial material from the channel openings removes all remaining of the sacrificial material from the channel openings.

23. A method of forming an array of elevationally-extending strings of memory cells, the memory cells individually comprising a programmable charge-storage transistor, the method comprising:

forming a stack comprising alternating insulative tiers and wordline tiers, the wordline tiers comprising control-gate material having terminal ends corresponding to control-gate regions of individual memory cells, a select gate tier being above an upper of the insulative tiers, channel openings extending through the alternating tiers and the select gate tier;

forming charge-storage material within the channel openings elevationally along the alternating tiers and the select gate tier and forming a charge-blocking region of the individual memory cells laterally between the charge-storage material and individual of the control-gate regions;

forming sacrificial material within the channel openings laterally over the charge-storage material that is laterally over the select gate tier and that is laterally over the alternating tiers;

first etching comprising etching elevationally-outer portions of each of the charge-storage material and the sacrificial material that are within the channel openings in at least one common etching step;

after the first etching, removing remaining of the sacrificial material from the channel openings;

after the removing, second etching comprising etching the charge-storage material within the channel openings that is below the select gate tier; and after the second etching, forming insulative charge-passage material then channel material within the channel openings laterally over the charge-storage material that is laterally over the wordline tiers.

24. The method of claim 1 wherein the etching comprising etching the charge-storage material within the channel openings below the select gate tier and leaves remnant charge-storage material within the channel openings laterally over the select gate tier.

25. The method of claim 23 wherein the first etching comprising etching the charge-storage material within the channel openings below the select gate tier, the first etching leaving remnant charge-storage material within the channel openings laterally over the select gate tier.

* * * * *